US005150118A

United States Patent [19]

Finkle et al.

[11] Patent Number: 5,150,118

[45] Date of Patent: Sep. 22, 1992

[54] INTERCHANGEABLE CODED KEY PAD ASSEMBLIES ALTERNATELY ATTACHABLE TO A USER DEFINABLE KEYBOARD TO ENABLE PROGRAMMABLE KEYBOARD FUNCTIONS

[75] Inventors: Thomas W. Finkle, Santa Rosa; Ralph M. Swanson, Sebastopol, both of Calif.

[73] Assignee: Hewlett-Packard Company, Palo Alto, Calif.

[21] Appl. No.: 629,059

[22] Filed: Dec. 14, 1990

Related U.S. Application Data

[63] Continuation of Ser. No. 348,826, May 8, 1989, abandoned.

[51] Int. Cl.[5] .......... H03M 11/02

[52] U.S. Cl. .......... 341/23; 341/22; 361/399; 364/708; 364/709.1

[58] Field of Search .......... 341/22, 23, 26, 33; 200/5 A; 235/145 R; 361/397-399; 400/472, 477, 479, 479.1, 490, 491-491.2; 364/708, 709.01, 709.1, 709.12

[56] References Cited

U.S. PATENT DOCUMENTS

| | | | |
|---|---|---|---|
| 4,092,527 | 5/1978 | Luecke | 341/22 X |
| 4,261,042 | 4/1981 | Ishiwatari et al. | 341/22 |
| 4,279,021 | 7/1981 | See et al. | 341/23 |
| 4,326,193 | 4/1982 | Markley et al. | 341/22 X |
| 4,333,155 | 6/1982 | Johnston | 341/22 X |
| 4,359,222 | 11/1982 | Smith, III et al. | 341/23 X |
| 4,441,001 | 4/1984 | Miyano et al. | 341/23 X |
| 4,490,587 | 12/1984 | Miller et al. | 200/512 |
| 4,532,575 | 6/1985 | Suwa | 341/22 |
| 4,764,770 | 8/1988 | Church | 341/22 |
| 4,778,952 | 10/1988 | Watkins et al. | 200/5 A |
| 4,890,832 | 1/1990 | Komaki | 341/23 X |

*Primary Examiner*—Donald J. Yusko
*Assistant Examiner*—Michael Horabik
*Attorney, Agent, or Firm*—William C. Milks, III

[57] ABSTRACT

Coded interchangeable key pad assemblies alternately installed on a keyboard so that one of a variety of programmable sets of keyboard functions is enabled for selection by user actuation of the keys. Each key pad assembly has a durable construction and is securely attachable to the remainder of the keyboard. Each key pad assembly is installed on the remainder of the keyboard and interacts with the system with which the keyboard interfaces, preferably a programmable system, to provide a custom key panel for the user so that key functions can be tailored to a desired selection of operations available to the user upon actuation of the keys.

18 Claims, 8 Drawing Sheets

INTERCHANGEABLE CODED KEY PAD ASSEMBLIES ALTERNATELY ATTACHABLE TO A USER DEFINABLE KEYBOARD TO ENABLE PROGRAMMABLE KEYBOARD FUNCTIONS

This application is a continuation of application Ser. No. 07/348,826, filed May 8, 1989, now abandoned.

BACKGROUND OF THE INVENTION

This invention relates to keyboards and, more particularly, to interchangeable key pad assemblies for providing at least a portion of a user keyboard. Specifically, one embodiment of the invention provides interchangeable key pad assemblies that are coded so that when they are alternately installed on a keyboard, one of a variety of programmable sets of keyboard functions is enabled for selection by user actuation of the keys.

One exemplary use of the invention is in association with molded rubber keyboards. Molded rubber keyboards have been used in combination with underlying printed circuit boards to provide a keyboard structure much less expensive than those where each key requires a separate push button member separately mounted in a frame. The term "rubber," as used in this specification and in the claims, refers not only to synthetic and natural rubbers, but also to other elastomeric materials.

Molded rubber keyboards usually comprise a rubber sheet integral with upwardly projecting rubber keys. Each rubber key is located above a recess in the sheet and its lower end includes such means as conductive rubber members for closing the switch contacts on the printed circuit board located directly below it. The recesses form a diaphragm which acts to space the conductive rubber members above the printed circuit board, except when a particular key is pressed.

Church, U.S. Pat. No. 4,764,770, for example, discloses a keyboard assembly which has a printed circuit board providing a series of switch contacts and a molded rubber keyboard providing a rubber base sheet overlying the printed circuit board and having a series of rubber keys integral with the base sheet. Each key has contacts on its bottom surface for closing each of the switch contacts when its key is depressed. Stabilizing membranes prevent the keys from wobbling or binding. Although undesirable wobbling or binding is substantially eliminated, the keyboard is either a dedicated keyboard or one whose key functions are determined by the system to which the keyboard is mounted.

Previously, overlays have been used to provide the user with identification of key functions for programmable or customizable key sets. Overlays are commonly used on computer keyboards and calculators. The typical overlay construction is a thin plastic sheet with screen-printed information. This material is not very durable and can be easily damaged. Furthermore, these overlays typically are not securely attached to the computer keyboards and calculators. Consequently, they are easily dislodged and slide from the keyboard, frustrating the user. Also, the functions of the keys are dedicated or determined by the computer or calculator since the overlay does not operatively interact with the system.

It is desirable to overcome the disadvantages of overlays by providing a more durable and secure means for identifying key functions. Furthermore, it is also desirable to interact with the system to identify which of a variety of sets of key functions is enabled for selection by the user.

SUMMARY OF THE INVENTION

One embodiment of the present invention provides interchangeable key pad assemblies that are coded so that when they are alternately installed on a keyboard, one of a variety of programmable sets of keyboard functions is enabled for selection by user actuation of the keys. Each key pad assembly has a durable construction and is securely attachable to the remainder of the keyboard. Each key pad assembly is installed on the remainder of the keyboard and interacts with the system with which the keyboard interfaces, preferably a programmable system, to provide a custom key panel for the user so that key functions can be tailored to a desired selection of operations available to the user upon actuation of the keys.

The custom key panel in accordance with the invention is less prone to damage than an overlay, is securely attached, and imparts flexibility to the mechanical configuration of keys. The flexibility in configuration provides the user only the necessary function keys for the particular application. This provides a less cluttered panel for an improved human interface.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings. In he drawings:

FIG. 2, comprising

FIG. 3, comprising

FIG. 4, comprising

DETAILED DESCRIPTION OF THE PREFERRED EMBODIMENTS

The custom key panel in accordance with the invention is an assembly of parts that preferably allows an interchangeable key pad assembly to be associated with system keyboard means to provide one of a variety of sets of key functions available to the user. The custom key panel provides direct execution of commands that typically are most frequently selected by the user.

In one embodiment, the custom key panel does not make an electrical connection when plugged in. It mechanically actuates switches for addressing a processor in the system with a unique identification code for each interchangeable assembly. This provides a very reliable system.

Figure 1:
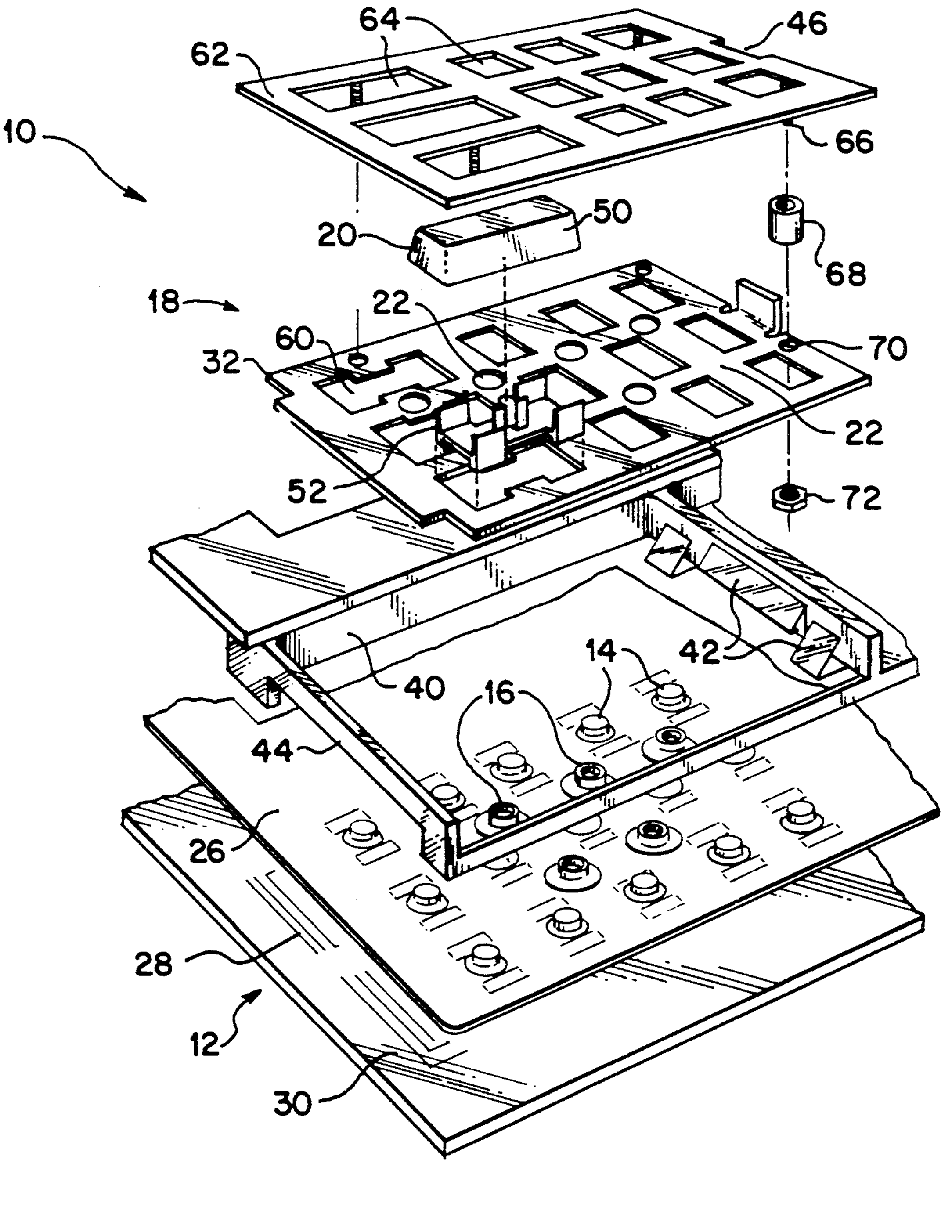
FIG. 1 is an exploded view of one embodiment of a custom key panel in accordance with the invention.
Figure 2A:
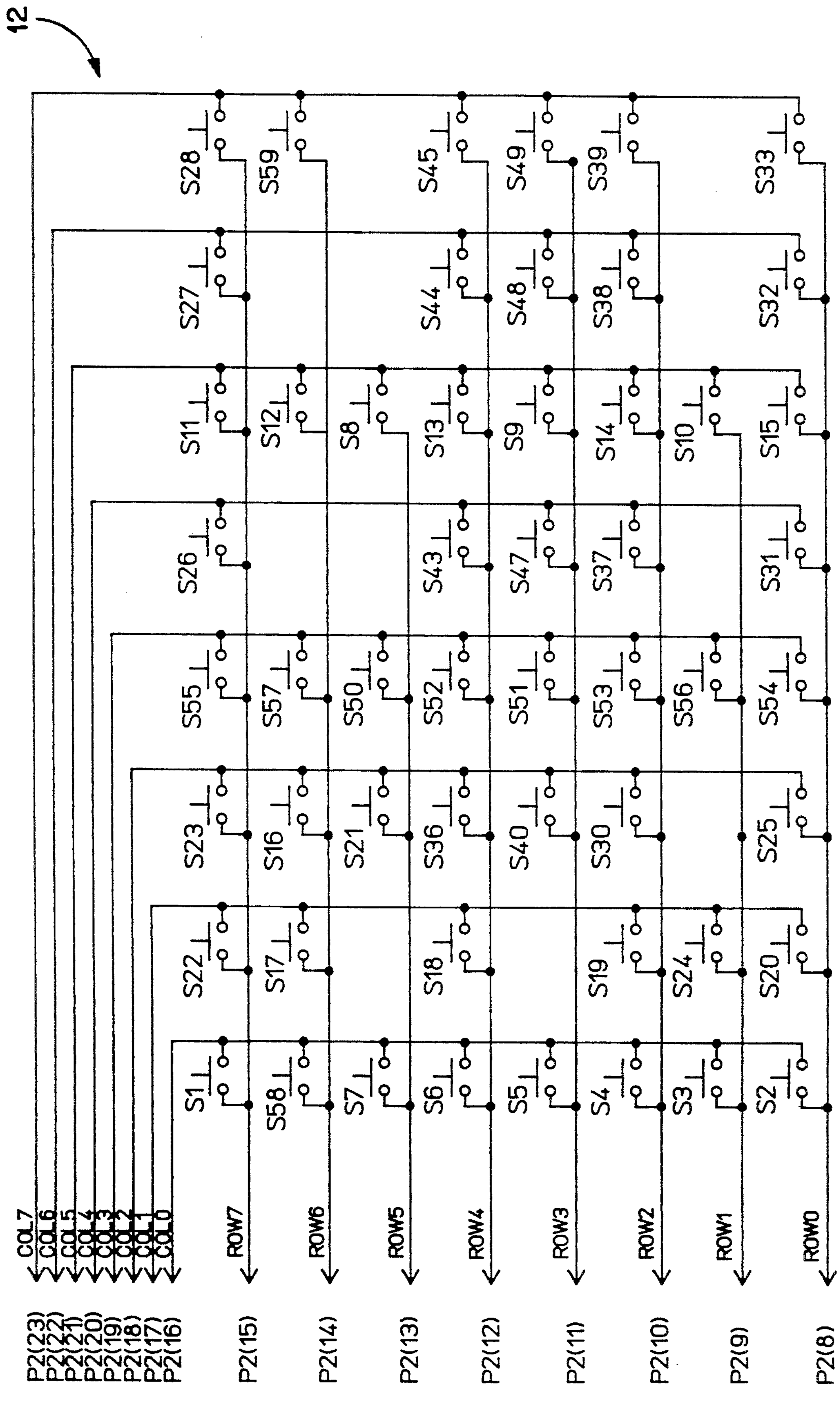
FIGS. 2A and 2B, is an electrical schematic drawings of the custom key panel shown in FIG. 1.
Figure 2B:
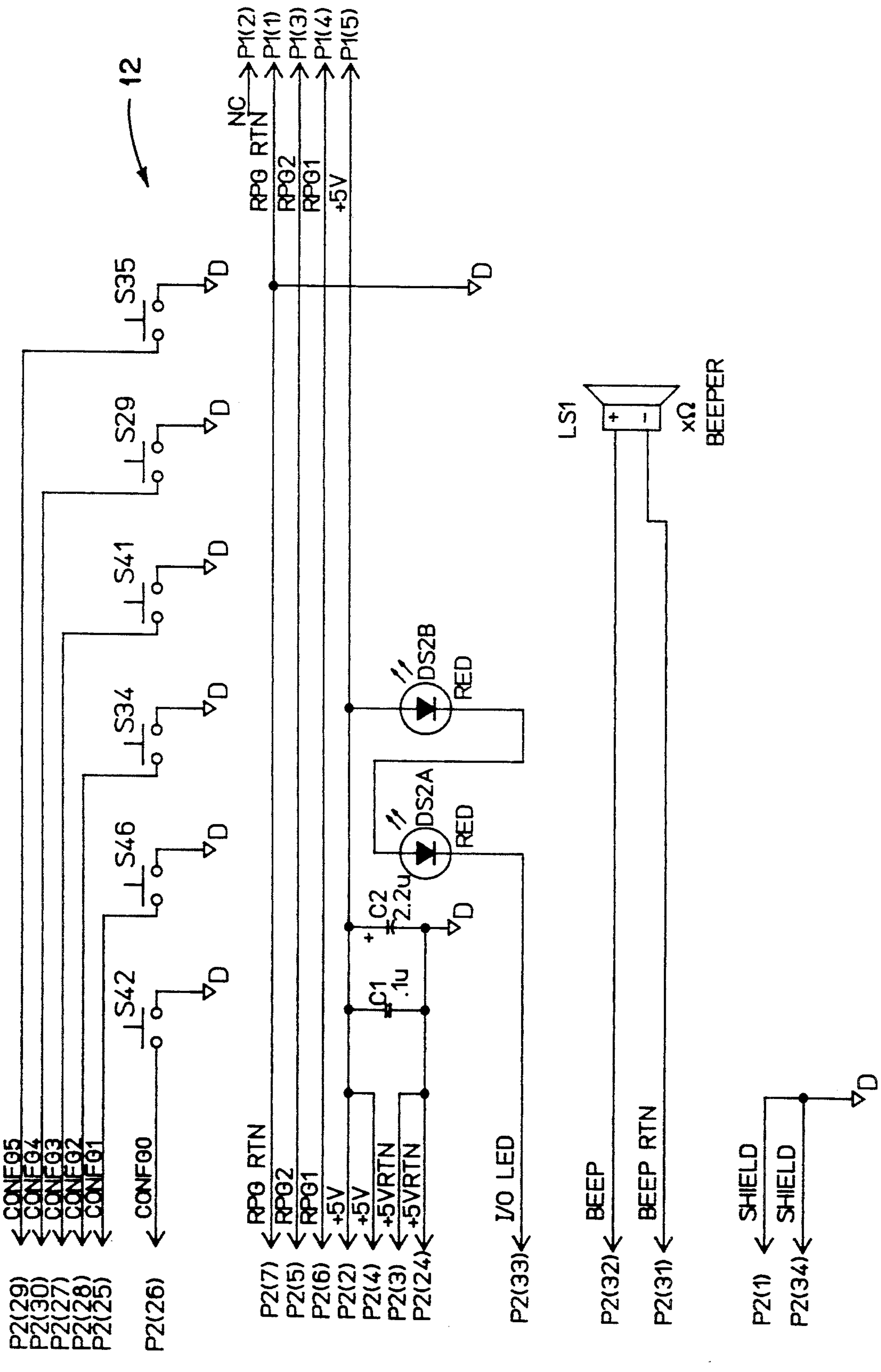

One embodiment of the custom key panel in accordance with the invention is generally indicated by the numeral 10, as shown in FIG. 1. The custom key panel 10 preferably comprises switch means 12 (see also FIGS. 2A and 2B) in the form of user selectable key means 14 and actuable key decoding means 16 (see also FIGS. 3A, 3B, and 3C), as shown in more detail in FIG. 8).

Figure 5A:
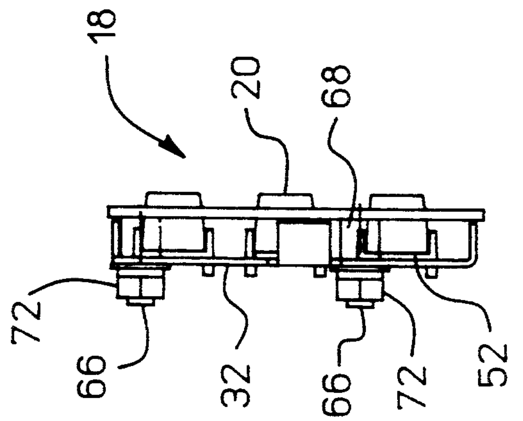
FIG. 5 is a detailed drawing of a subpanel of an interchangeable key pad assembly associated with the custom key pane-1 shown in FIG. 1, and FIGS. 5A and 5B are end and side elevation views of the interchangeable key pad assembly, respectively

The custom key panel 10 also preferably comprises key means 18 (see also FIG. 8) selectively mountable in relation to the switch means 12 for actuating the switch means. The key means 18 preferably comprises mechanical switch actuating means comprising at least one key 20 (see also FIGS. 5A, 5B, and 8) which is selectively actuable by the user. The key means 18 also comprises key encoding means 22 (see also FIG. 8) which actuates the key decoding means 16 when the key means is mounted in relation to the switch means 12 for identifying the function selectable by the user when at least one key 20 is actuated by the user.

Figure 3B:
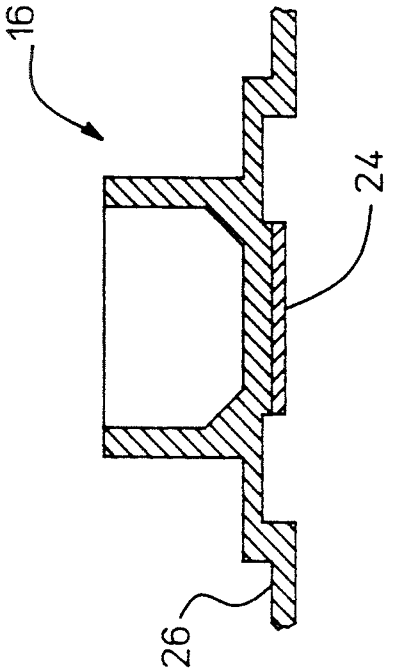
FIGS. 3A, 3B, and 3C, is a detailed drawings of a rubber keypad associated with the custom key panel shown in FIG. 1.
Figure 3C:
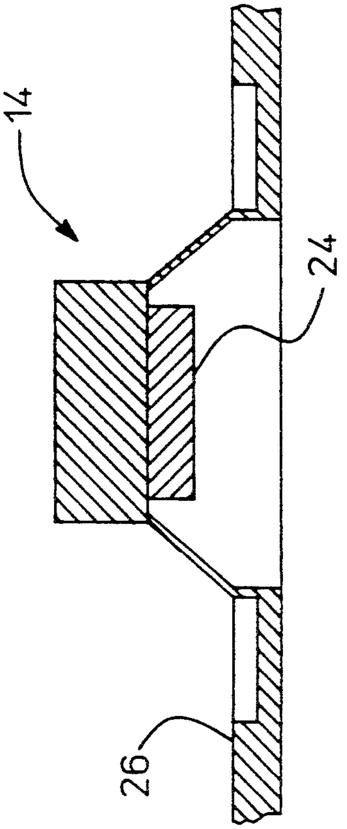
Figure 3A:
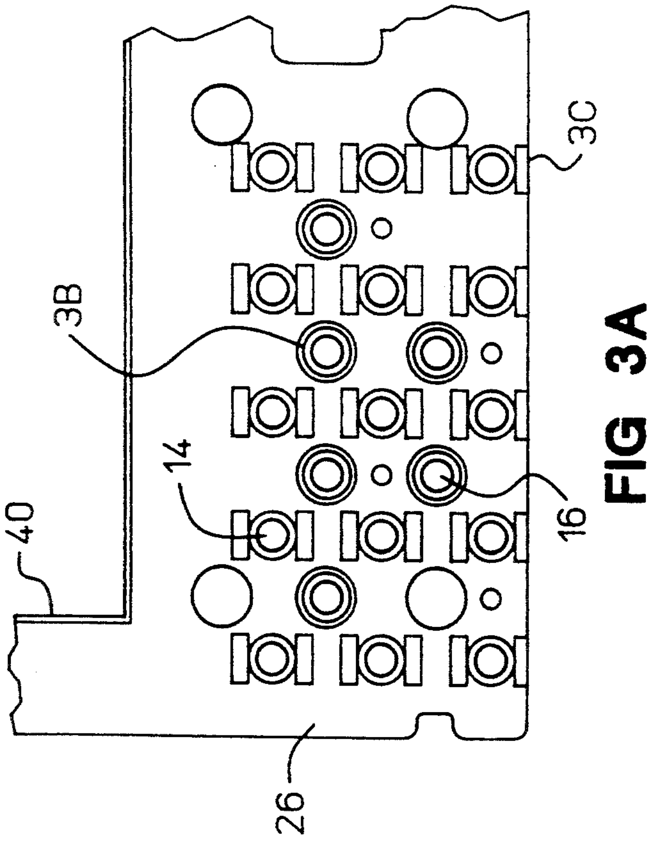
Figure 8:
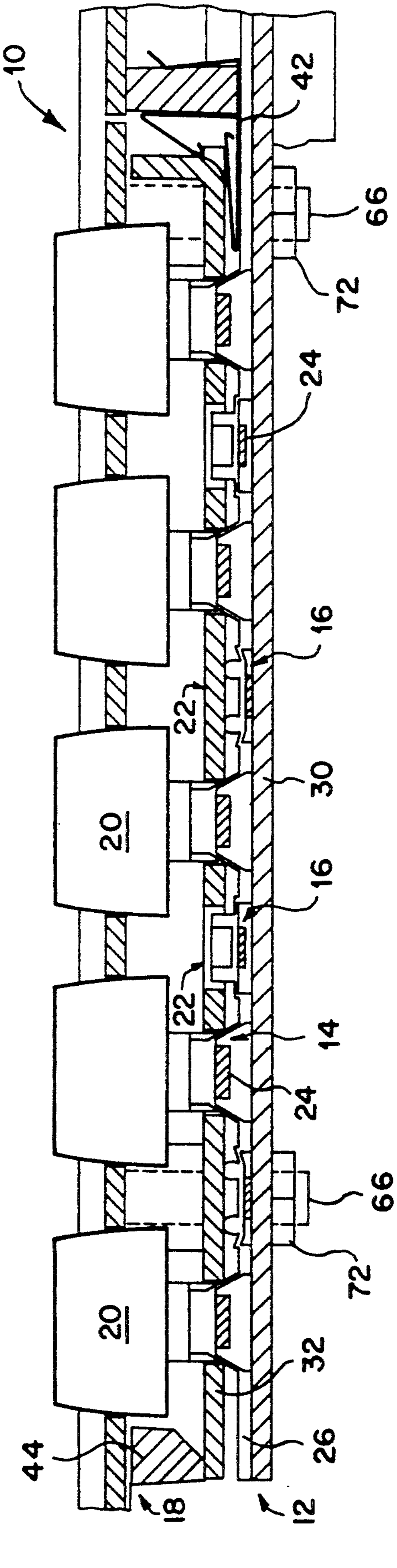
FIG. 8 is a cross-sectional view of an interchangeable key pad assembly installed on the custom key panel shown in FIG. 1.

The switches 14 and 16 are preferably conductive rubber members 24 or pellets compression molded into a sheet 26 of non-conductive rubber, forming the keypad or matrix of switches, as shown in FIGS. 3B, 3C, and 8. The conductive members 24 are held above traces 28 on a printed circuit board 30 (see also FIG. 8) by the non-conductive rubber sheet 26. When a switch 14 or 16 is depressed, the conductive member 24 shorts the traces for that location and is acknowledged by the processor as a closed switch.

There are preferably six binary address switches, which allow 64 possible custom key panel key function options. The six address switches are arranged in the same matrix as hole locations on a subpanel 32 (see also FIGS. 5 and 8) of the custom key panel assembly. The subpanel 32 can hold down an address switch 16 (ensuring closure) when there is no hole.

The configuration of each address switch 16 allows overtravel or compression of the rubber actuator without exerting excessive force on the assembly. This ensures switch closure under worst case tolerance stackup and bowing of the subpanel 32 and the keyboard. The address switches 16 preferably have a small travel of 0.5 mm to closure, then a large overtravel of 3.0 mm. The travel of standard key switches is typically 1.7 mm with no overtravel.

Figure 5:
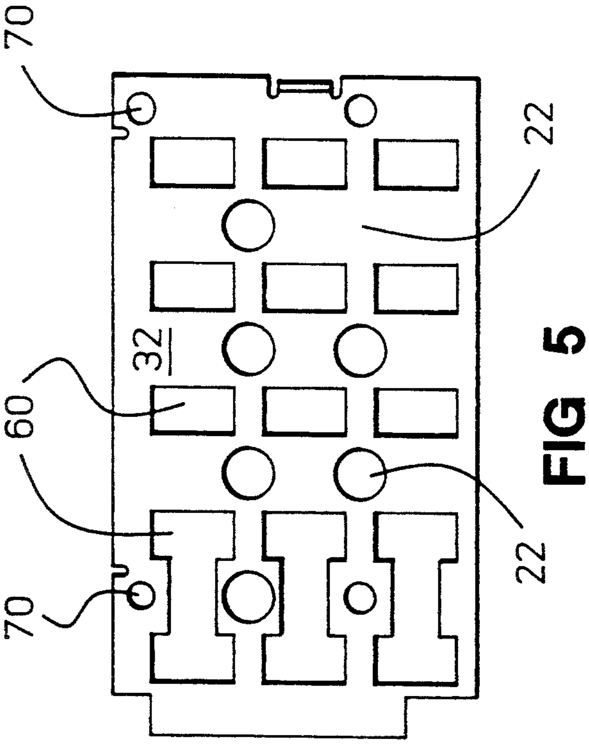
Figure 5B:
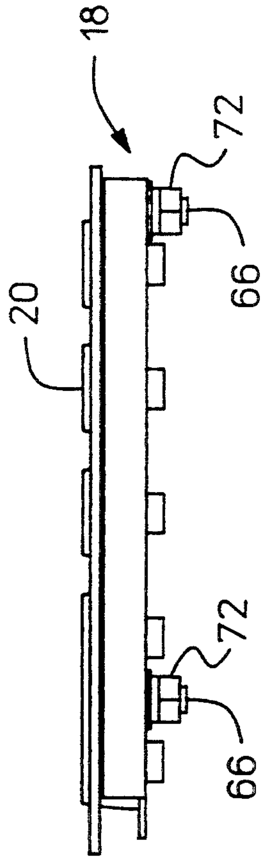
Figure 6:
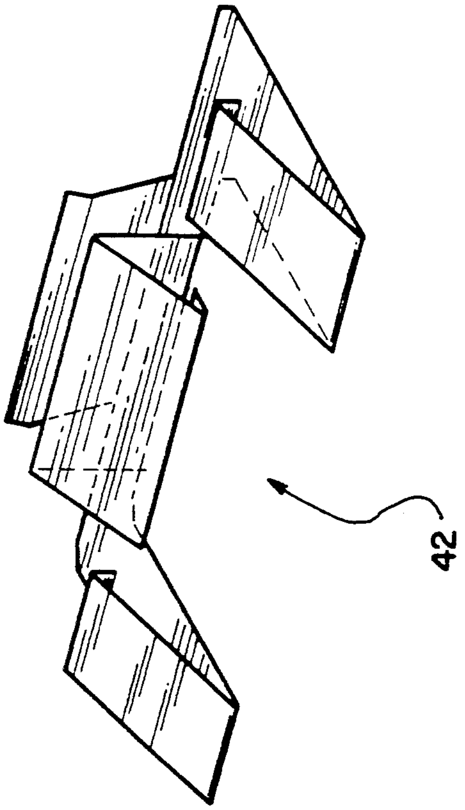
FIG. 6 is a detailed drawing of a spring retainer associated with the custom key panel shown in FIG. 1.

As shown in FIG. 5, the custom key panel 10 preferably allows an interchangeable key pad assembly 18 to be plugged into a front bezel 40 of an electronic instrument, such as the HP 70004A modular measurement system display/mainframe, to provide one of a variety of sets of key functions available to the user. The key pad assembly 18 is preferably retained in the bezel 40 by a mechanical spring 42, as shown in FIGS. 6 and 8. The spring 42 is installed from the backside of the bezel 40 and is retained by 10 the key pad. The spring 42 latches over the edge of the subpanel 32 to retain the right side of the assembly. The left side is sandwiched around a shelf 44 in the bezel 40, as shown in FIG. 8.

The key pad assembly 18 is installed by aligning the left side to the shelf 44 on the bezel 40, then rotating the assembly, around the shelf like a hinge until the spring 42 latches. The operation is similar to closing a door.

Figure 4B:
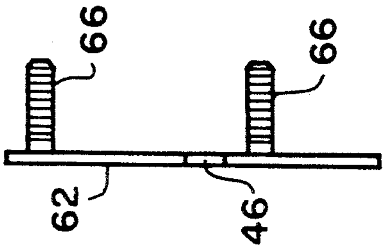
FIGS. 4A, 4B, and 4C, is detailed drawing of a front panel of an interchangeable key pad assembly associated with the custom key panel shown in FIG. 1.
Figure 4C:
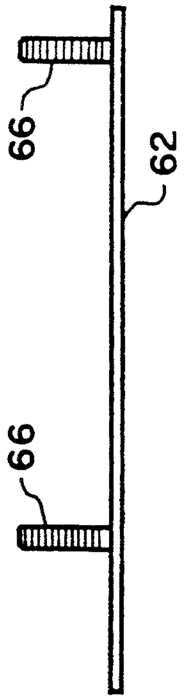
Figure 4A:
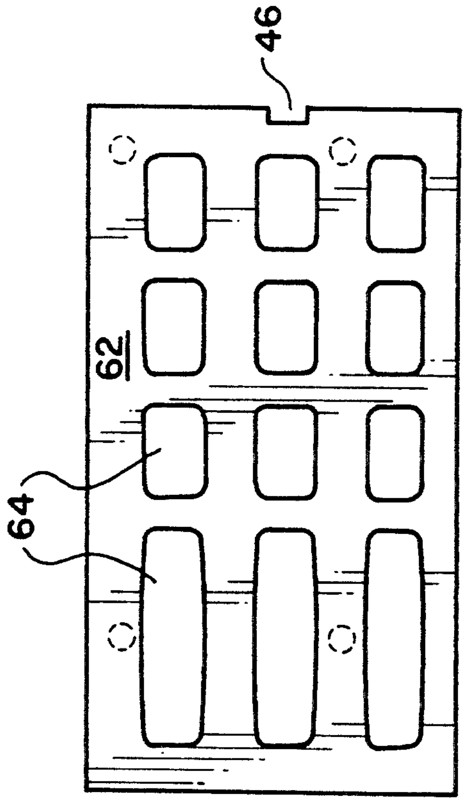

To remove the key pad assembly 18, an opening 46 (see also FIGS. 4A and 4B) is provided in the front panel to insert a tool, such as a screwdriver blade. As the screwdriver is pushed into the opening 46, the spring 42 is forced away from the subpanel 32, which disengages the key pad assembly 18. The key pad assembly 18 is then forced away from the key pad by another portion of the spring, and any residual force from the depressed address switches 16. The key pad assembly 18 comes to rest at a sufficient distance away from the bezel 40 to provide finger clearance to grab the key pad assembly 18 for removal.

Figure 7:
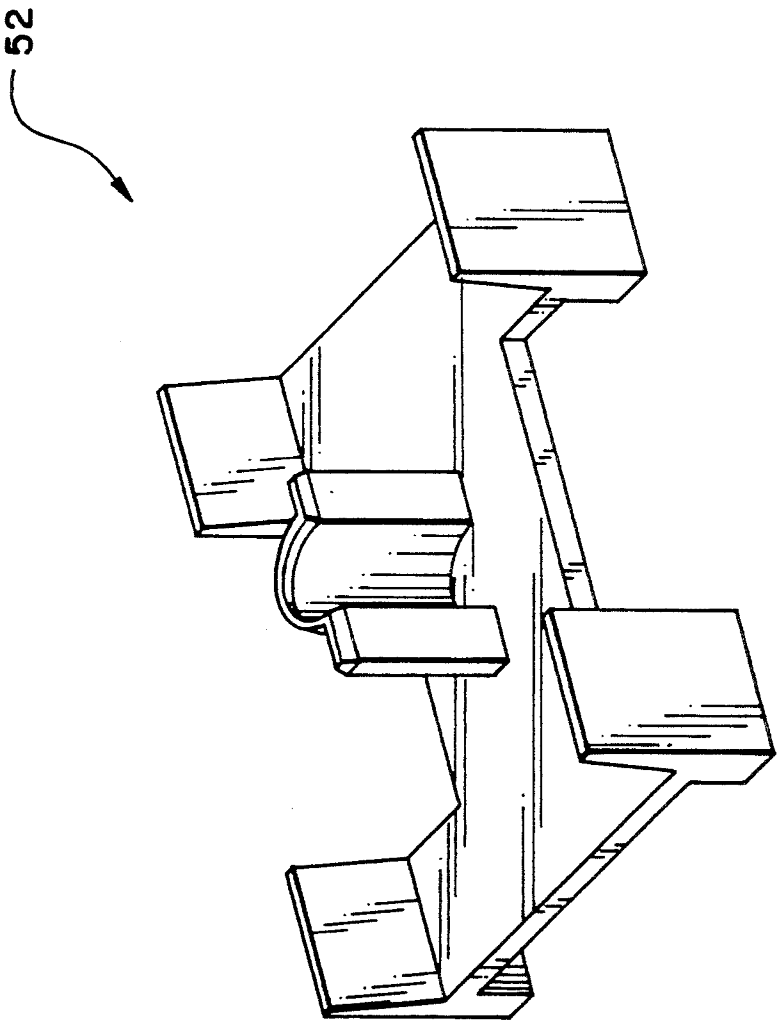
FIG. 7 is a detailed drawing of a key adapter for allowing conventional keys to be incorporated into the custom key panel shown in FIG. 1.

The key pad assembly 18 preferably utilizes conventional keycaps 50. The keycaps 50 are typically double shot injection molded keys with nomenclature integral to the keycap. Each keycap presses onto an adapter 52 shown in more detail in FIG. 7, allowing the keycap to function in the key pad assembly 18. Designers of custom key panels can modify these tools to create unique keycaps for each application.

This affords a great amount of flexibility to the design of future key panels. There can be, for example, fifteen separate keys. These can be either half wide keycaps or quarter wide keycaps. Or there can be as many as three double wide keycaps used in the far left column (major user keys) with the remaining nine locations either half or quarter keys. The front panel can be screen-printed to provide any required identification of the key functions.

When the custom key panel is removed from the instrument, the keycaps are preferably captivated and can not fall out. This is accomplished by providing the subpanel 32 with apertures 60 (see also FIG. 5) into which the keycaps 50 connected to the adapters 52 are deposited. A front panel 62 having apertures 64 (see also FIGS. 4A, 4B, and 4C) is then placed over the subpanel 32 and the keycaps 50 so that the apertures 64 align with the keycaps. The front panel 62 also includes welded studs 66 on which are fitted spacers 68 (see also FIGS. 4B, 4C, 5A, and 5B). The studs 66 extend through holes 70 (see also FIG. 5) in the subpanel 32, and nuts 72 (see also FIGS. 5A and 5B) are threaded on the studs to hold the key pad assembly 18 together. The key pad assembly is rugged and durable enough to withstand damage during abusive handling outside of the instrument.

This invention has many advantages beyond what overlays can offer. Where flexibility, reliability, durability, and optimized human interface are desired, this invention is an ideal solution. There are numerous applications that can benefit from using a custom key panel in accordance with the present invention.

The foregoing description is offered primarily for purposes of illustration. One modification is to mold the entire key pad assembly 18 from a plastic material. In another contemplated embodiment, the address switches can be replaced by electrical address coding means, such as a diode matrix or read only memory. While a variety of embodiments has been disclosed, it will be readily apparent to those skilled in the art that numerous other modifications and variations not mentioned above can still be made without departing from the spirit and scope of the invention as claimed below.

What is claimed is:

1. An interchangeable keyboard selectively actuable by a user, comprising:

switch means comprising:

user actuable means forming a portion of the switch means; and actuable key decoding means forming an additional portion of the switch means; and key means separate from and selectively coupled to the switch means, the key decoding means being actuated by coupling of the key means to the witch means independent of the user actuating the user actuable means, the key means comprising:

at least one key coupled to the user actuable means and selectively actuable by the user for actuating the user actuable means after the key means is coupled to the switch means; and key enclosing means coupled to the key decoding means and independent of the at least one key for actuating the key decoding means when the key means is coupled to the switch means for identifying a function selectable by the user after the key means is coupled to the switch means and the at least one key is thereafter actuated by the user, the function being dependent upon identification of the key means responsive to actuation of the key decoding means by the key encoding means when the key means is coupled to the switch means, identification of the function being determined dependent upon actuation of the key decoding means by the key encoding means and independent of actuation by the user of the at least one key;

wherein the switch means further comprises:

a printed circuit board having conductive elements applied to the surface of a dielectric material;

a keyboard element molded from elastomeric material and mounted overlying the printed circuit board, the keyboard element comprising:

a sheet of elastomeric material having at least one integral upwardly projecting elastomeric protrusion, the at least one protrusion overlying the conductive elements of the printed circuit board;

a conductive member retained within the at least one protrusion between the protrusion and the printed circuit board to interconnect the conductive elements of the printed circuit board when the protrusion is moved toward the printed circuit board;

the at least one key for moving the at least one protrusion toward the printed circuit board when the key is selectively actuated by the user;

at least one additional integral upwardly projecting elastomeric protrusion incorporated into the sheet of elastomeric material, the additional protrusion overlying the conductive elements of the printed circuit board; and a conductive member retained within the additional protrusion between the protrusion and the printed circuit board to interconnect the conductive elements of the printed circuit board when the protrusion is moved toward the printed circuit board;

the key encoding means for moving the additional protrusion toward the printed circuit board when the key means is coupled to the switch means, thereby activating the key decoding means.

2. The keyboard according to claim 1 wherein the switch means further comprises:

bezel means;

the printed circuit board being mounted to the bezel means;

the keyboard element being mounted to the bezel means overlying the printed circuit board: and wherein the key means comprises an interchangeable key pad assembly plugged into the bezel means to provide one of a variety of sets of key functions available to the user.

3. The keyboard according to claim 2 wherein the interchangeable key pad assembly is retained in the bezel means by a mechanical spring.

4. The keyboard according to claim 3 wherein the bezel means has a shelf and the interchangeable key pad assembly comprises:

a first side, the first side of the interchangeable key pad assembly being sandwiched around the shelf of the bezel means; and a second side, the mechanical spring latching over the second side of the interchangeable key pad assembly to retain the key pad assembly;

the interchangeable key pad assembly being installed by aligning the one side to the shelf of the bezel means, then rotating the key pad assembly around the shelf like a hinge until the mechanical spring latches the second side of the key pad assembly.

5. The keyboard according to claim 4 wherein the interchangeable key pad assembly further comprises:

an opening overlying the mechanical spring when the interchangeable key pad assembly is installed on the bezel means, the key pad assembly being removed by inserting a tool into the opening, the spring being forced away from the key pad assembly to disengage the key pad assembly, the key pad assembly being forced away from the bezel means by a portion of the spring and nay residual force from activated key decoding means, the key pad assembly coming to rest at a sufficient distance away from the bezel means to provide finger clearance to grab the key pad assembly for manual removal.

6. A custom key panel configured by one of a plurality of interchangeable key pad assemblies that ar coded so that when they are alternately installed on a keyboard, one of a variety of programmable sets of keyboard functions is enabled for selection by user actuation of keys on the installed key pad assembly, comprising:

a printed circuit board having a plurality of sets of conductive elements applied to the surface of a dielectric material;

an elastomeric sheet having a plurality of recesses positioned opposite the plurality of sets of conductive elements of the printed circuit board;

a plurality of elastomeric keys located in line with the plurality of recesses in the sheet and at a distance from the printed circuit board, each key having a conductive member for closing the set of conductive elements on the printed circuit board in line with the key;

each recess forming a diaphragm which acts to space each associated conductive member above each set of conductive elements on the printed circuit board in line with the recess, except when a particular elastomeric key is pressed;

the plurality of elastomeric keys forming a switch means comprising a) user actuable means and b) actuable key decoding means, the key decoding means being actuated by coupling of an interchangeable key pad assembly to the plurality of elastomeric keys independent of the user actuating the user actuable means; and the interchangeable key pad assembly associated with the custom key panel comprising:

a front panel;

a subpanel;

a least one key projecting through the front panel and selectively actuable by the user for actuating the user actuable means after the key pad assembly is coupled to the switch means; and key encoding means independent of the at least one key for actuating the key decoding means when the key pad assembly is coupled to the switch means for identifying a function selectable by the user after the key pad assembly is coupled to the switch means and the at least one key is thereafter actuated by the user, the function being dependent upon identification of the key pad assembly responsive to actuation of the key decoding means by the key encoding means when the key pad assembly is coupled to the switch means, identification of the function being determined dependent upon actuation of the key decoding means by the key encoding means and independent of actuation by the user of the at least one key;

whereby the interchangeable key pad assembly when associated with the custom key panel provides one of a variety of sets of key functions available to the user.

7. The custom key panel according to claim 6 wherein the interchangeable key pad assembly provides at least a portion of a user keyboard, the key pad assembly being coded so that when the key pad assembly is alternately installed, one of a variety of programmable sets of keyboard functions is enabled for selection by user actuation of the at least one key on the key pad assembly, the key pad assembly being coded for identifying the key function, the key pad assembly interacting within an external processor incorporated into a system with which the custom key panel is associated to identify which of a variety of sets of key functions is enabled for selection by the user.

8. The custom key panel according to claim 7 wherein the system with which the interchangeable key pad assembly is associated is a programmable system.

9. The custom key panel according to claim 7 wherein the interchangeable key pad assembly is configured to not make an electrical connection when plugged in the custom key panel but rather mechanically actuates switches for addressing the external processor with a unique identification code for the key pad assembly.

10. The custom key panel according to claim 6, further comprising a spring retainer associated with the custom key panel for installing the interchangeable key pad assembly on the custom key panel.

11. The custom key panel according to claim 6 wherein the at least one key comprises a key adapter for allowing a conventional key to be incorporated into the interchangeable key pad assembly.

12. An interchangeable custom key panel comprising:

a matrix of switches comprising:

user actuable switches; and actuable key decoding switches; and key means separate from and selectively engageable with the matrix of switches for actuating the matrix of switches, the key decoding switches being actuated by coupling of the key means to the matrix of switches independent of the user actuating the user actuable switches, the key means comprising:

switch actuating means comprising at least one key which is selectively actuable by the user for actuating at least one user actuable switch; and key encoding means independent of the at least one key which actuates the key decoding switches when the key means is engaged with the matrix of switches for identifying a function selectable by the user after the key means is coupled to the matrix of switches and the at least one key is thereafter actuated by the user, thereby allowing the custom key panel to provide direct execution of a function selected by the user, identification of the function being determined dependent upon actuation of the key decoding switches by the key encoding means and independent of actuation by the user of the at least one key;

wherein the matrix of switches further comprises:

a printed circuit board having conductive elements applied to the surface of a dielectric material;

a keyboard element molded from elastomeric material and mounted overlying the printed circuit board, the keyboard element comprising:

a sheet of elastomeric material having at least one integral upwardly projecting elastomeric protrusion, the at least one protrusion overlying the conductive elements of the printed circuit board; and a conductive member retained within the at least one protrusion between the protrusion and the printed circuit board to interconnect the conductive elements of the printed circuit board when the protrusion is moved toward the printed circuit board;

the at least one key for moving the at least one protrusion toward the printed circuit board when the key is selectively actuated by the user;

at least one additional integral upwardly projecting elastomeric protrusion incorporated into the sheet of elastomeric material, the additional protrusion overlying the conductive elements of the printed circuit board; and a conductive member retained within the additional protrusion between the protrusion and the printed circuit board to interconnect the conductive elements of the printed circuit board when the protrusion is moved toward the printed circuit board;

the key encoding means for moving the additional protrusion toward the printed circuit board when the key means is coupled to the matrix of switches, thereby activating the key decoding means.

13. The custom key panel according to claim 12 wherein the key means is alternately installed on a keyboard so that one of a variety of programmable sets of keyboard functions is enabled for selection by user actuation of the at least one key, each key means having a durable construction and being securely attachable to the remainder of the keyboard to interact with a system with which the keyboard interfaces to provide a custom key panel for the user so that key functions can be tailored to a desired selection of operations available to the user upon actuation of the at least one key.

14. The custom key panel according to claim 13 wherein the matrix of switches comprises conductive elastomeric members compression molded into a sheet of non-conductive elastomeric material forming a key matrix of switches, the conductive members being held above traces on the printed circuit board by the non-conductive sheet so that when the at least one key is pressed, the conductive member shorts the traces for that location and is acknowledged by an external processor coupled to the traces as a closed switch.

15. The custom key panel according to claim 14 wherein there are six binary key encoding means in the form of alternate unrelieved and relieved portions of the key means, thereby allowing 64 possible custom key panel key function options.

16. The custom key panel according to claim 14 wherein the configuration of each key decoding switch allows overtravel and compression without exerting excessive force on the key means, thereby ensuring switch closure under worst case tolerance stack-up and bowing of the key means and the keyboard.

17. The custom key panel according to claim 14 wherein the key means incorporates keycaps comprising double shot injection molded keys with nomenclature integral to the keycaps, each keycap being pressed onto an adapter allowing the keycap to function in the key means, whereby custom key panels can be easily created.

18. The custom key panel according to claim 17 wherein the key means comprises:

a subpanel having apertures into which the keycaps connected to the adapters are deposited;

a front panel having apertures, the front panel being placed over the subpanel and the keycaps so that the apertures in the front panel align with the keycaps and the apertures in the subpanel;

studs mounted on the front panel;

spacers fitted on the studs, the studs extending through holes in the subpanel; and nuts threaded on the studs to hold the keycaps sandwiched between the subpanel and the front panel so that when the custom key panel is removed the keycaps are captured and can not fall out.

* * * * *

UNITED STATES PATENT AND TRADEMARK OFFICE

CERTIFICATE OF CORRECTION

PATENT NO. : 5,150,118

DATED : September 22,1992

INVENTOR(S) : Thomas W. Finkle and Ralph M. Swanson

It is certified that error appears in the above-identified patent and that said Letters Patent is hereby corrected as shown below:

Column 5, Line 7, "key means to the witch" should read -- key means to the switch --;

Column 6, Line 41, "that ar coded" should read -- that are coded --;

Column 7, Line 7, "a least one" should read -- at least one --;

Column 2, Line 33, "In he drawings" should read -- In the drawings --;

Column 2, Line 37, "schematic drawings" should read -- schematic drawing"

Column 2, Line 40, "is a detailed drawings" should read -- is a detailed drawing --;

Column 2, Line 42, "is detailed" should read -- is a detailed --;

Column 2, Line 48, "key pane-1" should read -- key panel --;

Column 6, Line 34, "and nay residual" should read -- and any residual --.

Signed and Sealed this

Twenty-first Day of December, 1993

*Attest:*

BRUCE LEHMAN

*Attesting Officer* *Commissioner of Patents and Trademarks*